United States Patent [19]
Hu et al.

[11] Patent Number: 5,599,728
[45] Date of Patent: Feb. 4, 1997

[54] METHOD OF FABRICATING A SELF-ALIGNED HIGH SPEED MOSFET DEVICE

[75] Inventors: Chenming Hu, Alamo; Hsing-Jen Wann, Albany, both of Calif.

[73] Assignee: Regents of the University of California, Oakland, Calif.

[21] Appl. No.: 330,505

[22] Filed: Oct. 28, 1994

Related U.S. Application Data

[63] Continuation-in-part of Ser. No. 224,363, Apr. 7, 1994, Pat. No. 5,489,792.

[51] Int. Cl.$^6$ .......... H01L 21/265; H01L 21/302; H01L 21/76; H01L 21/306
[52] U.S. Cl. .......... 437/44; 437/45; 437/69
[58] Field of Search .......... 437/45, 69, 41, 437/44; 257/332, 333, 396, 397, 402; 431/41 GS, 41 CS

[56] References Cited

U.S. PATENT DOCUMENTS

| | | | |
|---|---|---|---|
| 4,697,198 | 9/1987 | Komori et al. | 357/23.3 |
| 4,746,960 | 4/1988 | Valeri et al. | 357/23.7 |
| 4,784,968 | 11/1988 | Komori et al. | 437/41 |
| 4,899,202 | 2/1990 | Blake et al. | 357/23.7 |
| 4,948,745 | 8/1990 | Pfiester et al. | 437/41 |
| 4,961,165 | 10/1990 | Ema | 365/182 |
| 4,985,744 | 1/1991 | Spratt et al. | 357/43 |
| 4,990,983 | 2/1991 | Custode et al. | 257/397 |
| 5,072,277 | 12/1991 | Sakakibara et al. | 357/42 |
| 5,095,348 | 3/1992 | Houston | 357/23.7 |
| 5,102,809 | 4/1992 | Eklund et al. | 437/21 |
| 5,116,771 | 5/1992 | Kurulkar | 437/40 |
| 5,125,007 | 6/1992 | Yamaguchi et al. | 357/23.7 |
| 5,160,989 | 11/1992 | Houston | 257/347 |
| 5,212,397 | 5/1993 | See et al. | 257/347 |
| 5,219,768 | 6/1993 | Okita | 437/34 |
| 5,243,210 | 9/1993 | Naruke | 257/320 |
| 5,258,318 | 11/1993 | Buti et al. | 437/34 |
| 5,264,721 | 11/1993 | Gotou | 257/349 |
| 5,355,011 | 10/1994 | Takata | 257/408 |
| 5,359,221 | 10/1994 | Miyamoto et al. | 257/408 |
| 5,399,525 | 3/1995 | Blanchard | 437/186 |
| 5,413,949 | 5/1995 | Hong | 437/44 |

FOREIGN PATENT DOCUMENTS

| | | | |
|---|---|---|---|
| 3-54-111783 | 9/1979 | Japan | 257/346 |
| 3-62-054466 | 10/1987 | Japan | 257/345 |
| 4-05-283687 | 10/1993 | Japan | 257/345 |

OTHER PUBLICATIONS

Colinge, J. P., "Reduction of Floating Substrate Effect in Thin-Film SOI MOSFETs," H-P Labs., 23rd Dec. 1985, 1 page.

Young, K. K. et al., "Avalance-Induced Drain-Source Breakdown in SOI n-MOSFETs," IEEE Trans. Elec. Devices, vol. 35, No. 4, Apr. 1988.

*Primary Examiner*—Mary Wilczewski
*Assistant Examiner*—Brian K. Dutton
*Attorney, Agent, or Firm*—Townsend and Townsend and Crew LLP; Henry K. Woodward

[57] ABSTRACT

A high speed MOSFET device includes a punchthrough stopper region in the channel of the device formed by high energy ion implantation through the gate electrode and self-aligned therewith. The device has reduced capacitance. A self-aligned recessed channel MOSFET structure includes the punchthrough stopper region to further improve short channel device behavior.

4 Claims, 5 Drawing Sheets

Sacrificial Oxide Growth and Threshold/Punchthrough Implant

Deep Source/Drain Implant

Spacer Etch, Oxide Deposition and Shallow Source/Drain Extension Implant

Nitride Spacer Formation

Recess Channel Formation

Self-Aligned Gate Electrode Etch

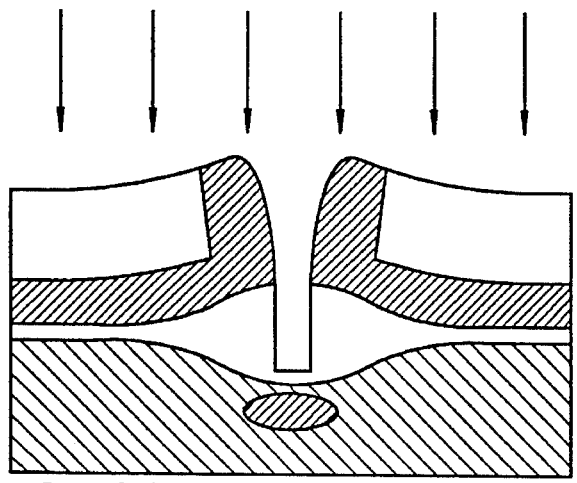
FIG. 4D  Sacrificial Oxide Growth and Threshold/Punchthrough Implant
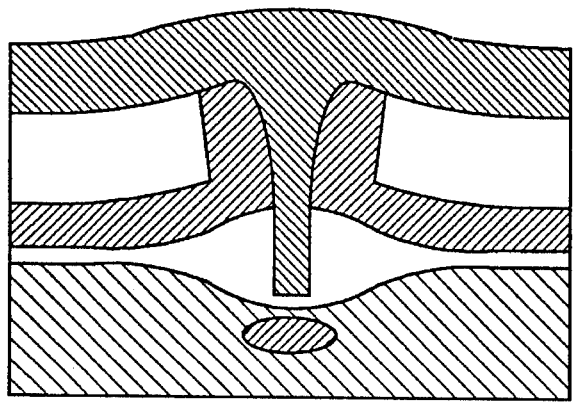
FIG. 4E  Gate Oxide Growth and Gate Electrode Deposition
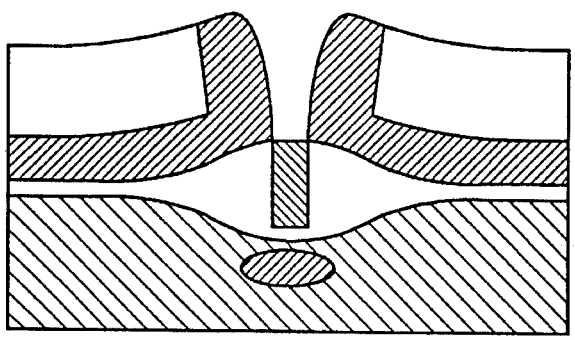
FIG. 4F  Gate Electrode Patterned by Etch-Back
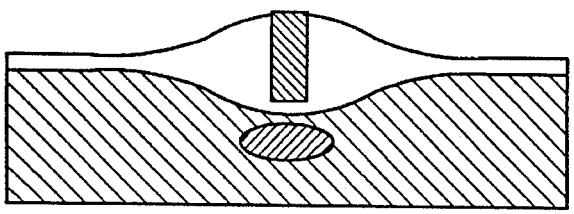
FIG. 4G  Nitride and Oxide Removal Deep Source/Drain Implant Source/Drain Salicide Spacer Etch, Oxide Deposition and
Shallow Source/Drain Extension Implant

METHOD OF FABRICATING A SELF-ALIGNED HIGH SPEED MOSFET DEVICE

This application is a Continuation-In-Part of application Ser. No. 08/224,363, filed Apr. 7, 1994, now U.S. Pat. No. 5,489,792, entitled for Silicon-On-Insulator Transistors Having Improved Current Characteristics and Reduced Electrostatic Discharge Susceptibility.

BACKGROUND OF THE INVENTION

This invention relates generally to semiconductor devices and fabrication processes, and more particularly the invention relates to self-aligned MOSFET structures especially useful for ultra large scale integration (ULSI).

MOSFET technology is the dominant technology for VLSI (very large integrated circuits), whose applications can be found in microprocessors, application specific integrated circuits (ASIC), and semiconductor memories, currently a seventy billion dollar market with high growth potential. The device structures and the operation principles of MOSFET devices can be found in the book *Physics of Semiconductor Devices* by S. M. Sze, for example. One of the most important attractive features of MOSFET technology is that MOSFET devices can be built in a very small area, which facilitates very dense circuits and a high level of integration. Scaling is a term used to describe the continuous effort of building smaller MOSFET devices. The degree of scaling is commonly measured by the MOSFET channel length, which is defined by photolithography. Short channel (i.e., sub-micron) MOSFETs exhibit problems usually described as the short channel effect, which includes $V_T$ roll-off where the threshold voltage decreases as the channel length decreases; the drain-induced barrier lowering effect, DIBL, where the subthreshold current and the subthreshold swing increases with drain voltage; and the punchthrough effect where drain voltage causes current to flow deep under the channel. These effects emerge when the channel length is very short because the gate electrode loses control over the potential barrier in the channel between the source and the drain.

It is well known that for the gate to have stronger control over the potential barrier in the channel, the gate oxide thickness must decrease, and the substrate doping concentration must increase. Hence the common scaling scenario is to decrease the channel length, decrease the gate oxide thickness, and increase the substrate doping concentration. In principle, the substrate doping concentration can be increased in accordance with the thinness of the gate oxide to achieve the desirable threshold voltage and to suppress the short channel effect. This is usually achieved by a channel implant and a punchthrough-stopper implant. However, when the substrate doping concentration is too high, the carrier transport suffers from impurity scattering. Further, the junction capacitance that increases with higher substrate doping concentration adversely affects the MOSFET switching speed. Thus, to simply increase the substrate doping concentration straightforwardly in short channel MOSFET is the standard, but not an ideal, solution.

It is highly desirable to have a local, retrograded doping in the channel region. Local doping in the channel can keep the source and drain region from overlapping in a lightly-doped substrate thereby keeping junction capacitance small. Retrograded doping can ensure a robust punchthrough-stopper without using high impurity concentration in the channel thereby preventing mobility degradation. One proposal has been to use one additional photolithography step to shield the source/drain regions while performing the local doping implantation. However, this proposal is not desirable due to the additional photolithography step needed, which increases manufacturing cost. It should be noted that the added photolithography step is critical because it is in the gate region yet it is not self-aligned. Further, the implant has to be performed before the gate formation and thus will go through subsequent oxidation and thermal annealing steps such as gate oxidation and the source/drain annealing. Consequently, a high degree of vertical and lateral localization of the dopant atoms cannot be achieved, hence a high dopant dose is needed which results in mobility degradation and increased junction capacitance. Though this solution is not practical, it does demonstrate that if the junction capacitance is reduced, the gate delay time can reduced 40% from what is achievable with conventional MOSFET technology.

The present invention provides high speed MOSFET technology with relatively easy control of dopant diffusion and requires no additional or critical photolithography steps for the channel and the punchthrough stopper implant.

SUMMARY OF THE INVENTION

Briefly, a punchthrough-stopper is formed in the channel region of a MOSFET device after formation of the gate electrode by high energy implantation of ions through the gate electrode structure and into the channel, resulting in self-alignment of the stopper under the gate electrode with the punchthrough stopper centrally disposed in the channel region and with reduced junction capacitance. The stopper region can be formed before or after the source and drain regions are formed during the same masking step as the source and drain dopant implant. Threshold adjustment implant can be made concurrently.

In another embodiment of the invention, the punchthrough-stopper process is combined with a self-aligned recessed channel process in which a short channel length is formed using well-controlled deposition and etching processes.

The invention and objects and features thereof will be more readily apparent from the following description and appended claims when taken with the drawing.

DETAILED DESCRIPTION OF ILLUSTRATIVE EMBODIMENTS

Figures 1, 2:
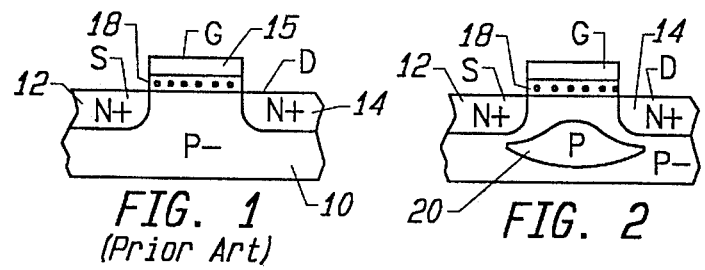
FIG. 1 is a section view of a conventional MOSFET device.
FIG. 2 is a section view of a MOSFET device in accordance with one embodiment of the invention.

FIG. 1 is a section view of a conventional MOSFET device. In this embodiment an $N^-$ channel enhancement mode transistor is fabricated in a $P^-$ monocrystalline silicon substrate 10. $N^+$ source 12 and drain 14 regions are formed in the surface of substrate 10 with a channel region therebetween controlled by voltage applied to a gate electrode 14 formed over the channel region and separated therefrom by an insulative layer 18 of silicon oxide or silicon nitride.

As noted above, the short channel effect, DIBL effect, and punchthrough effect occur in MOSFET devices having channels of sub-micron length. Heretofore, a channel implant and punchthrough stopper implant have been used to increase gate voltage control over the conductance in the channel region and prevent punchthrough.

The present invention provides an improved method of channel implant and punchthrough stopper implant to provide the MOSFET device of FIG. 2. This device is similar to the device of FIG. 1, and like elements have the same reference numerals. However, the P punchthrough stopper 20 is formed between the source 12 and drain 14 below the P⁻ channel region. Importantly, a self-aligned implant is utilized for the punchthrough stopper and for a threshold adjustment implant, whereby junction capacitance is reduced and short channel behavior is improved.

Figure 3A:
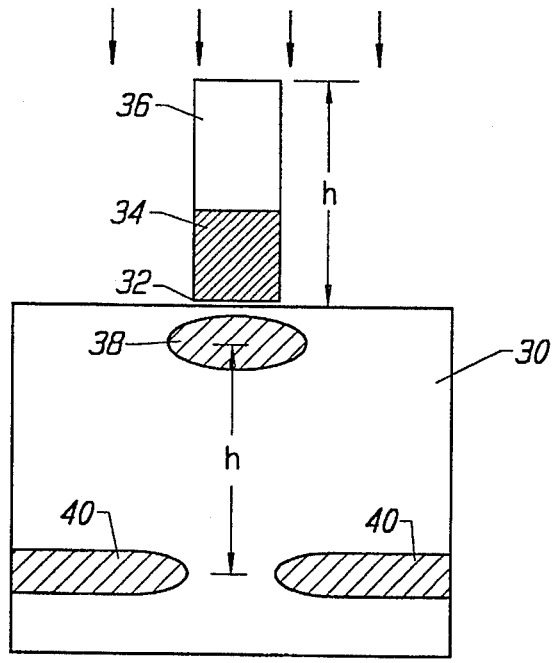
FIGS. 3A–3C are section views illustrating process steps in fabricating the device of FIG. 2o FIGS. 4A–4J are section views illustrating process steps in fabricating a MOSFET device in accordance with another embodiment of the invention.
Figure 3B:
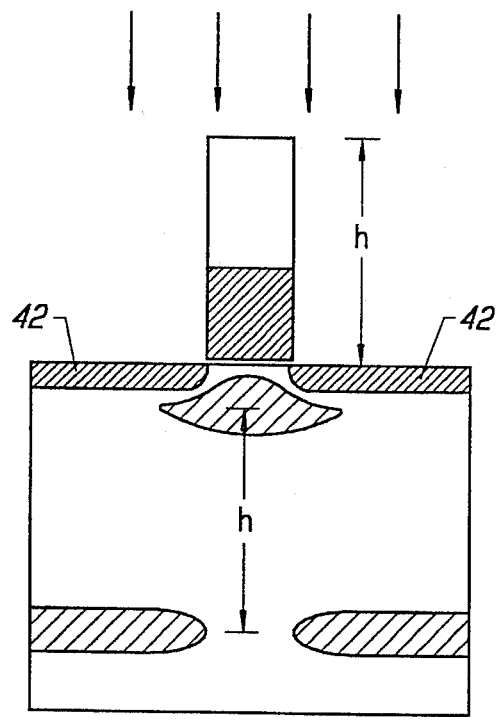
Figure 3C:
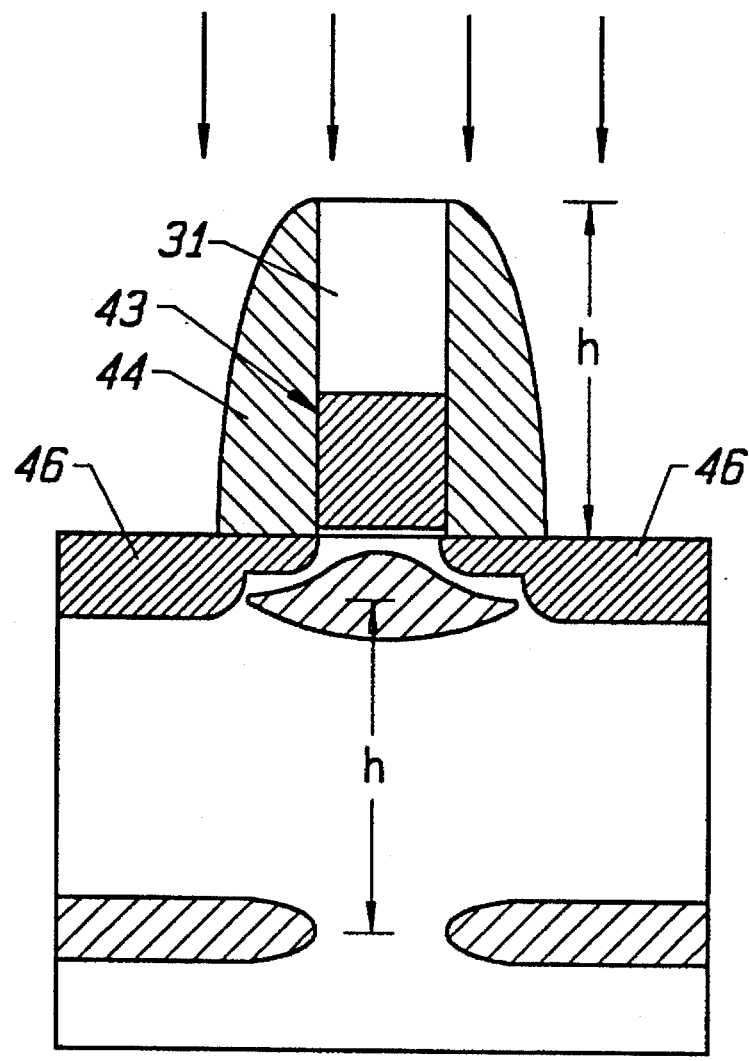

As shown in FIGS. 3A–3C, the punchthrough stopper implant and any threshold adjust implants are made by high energy implant into the substrate 30 through the stacked gate structure including insulation 32, gate contact 34, and photoresist 36. The dose and energy are chosen so that the peak implanted-ion concentration is located roughly along the punchthrough path (region 38). In the region not under the gate stack, such as the future source/drain regions, the high energy implantation will place the implant dose deep into the substrate, thereby not affecting the junction capacitance (region 40). The difference in the locations of the implanted ions under the gate region and under the source/drain region can be easily adjusted by the gate-stack height, h, which is determined by the gate electrode thickness (region 34), photoresist 36, and insulating layer (e.g., silicon nitride or silicon dioxide) thickness (region 32). Since this implant is performed after the gate formation, thermal diffusion of the implanted dopants is reduced and oxidation-enhanced diffusion is avoided. As a result, lower dose is needed and the junction capacitance can be greatly reduced.

The punchthrough-stopper/threshold-adjustment implants can be performed after gate patterning (FIG. 3A), after source/drain extension (region 42) implantation (FIG. 3B), after polysilicon spacer (region 44) formation (FIG. 3C), or after the deep source/drain (region 46) implantation and anneal (FIG. 3C). In FIGS. 3A and 3B the punchthrough-stopper/threshold-adjustment implants can be performed at the same masking step as the source/drain extension implant. The punchthrough-stopper/threshold-adjustment implants will be highly localized because they are confined only under the gate electrode and not under the spacers. In FIG. 3C, the punchthrough-stopper implant is performed under the same masking step as for the implant of the deep source/drain junction. The punchthrough-stopper/threshold-adjustment implants can be performed after the source/drain anneal, and the local punchthrough-stop implant will experience the least thermal diffusion. However, an additional masking step might be needed for the last case. In all three cases, self-aligned punchthrough-stopper/threshold-adjustment implants can be carried out with an angle from the vertical direction as in the known large angle tilt implanted drain (LATID) implantation. Doing so will further narrow the lateral localization of the implanted dopants.

Figure 4A:
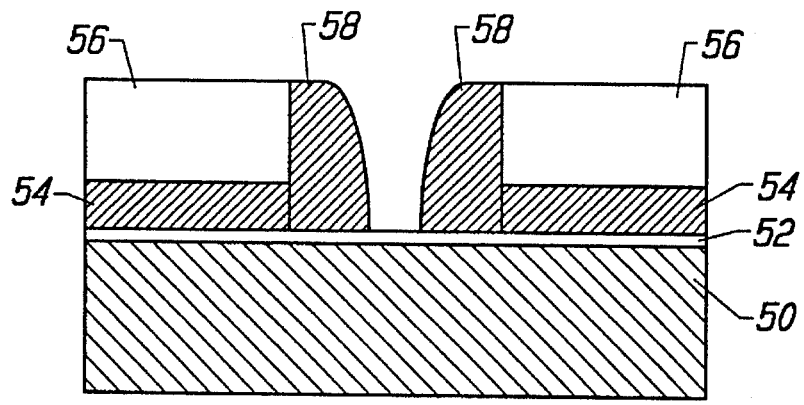

FIGS. 4A–4J are section views illustrating process steps in fabricating a MOSFET device in accordance with another embodiment of the invention. This process has the features of defining short channel length using well-controlled deposition and etching processes, forming a self-aligned recess channel with low parasitic capacitance, using highly conformal chemical vapor deposition (CVD) process to form the gate electrode, and drain-extension doping-profile tailoring. The recess channel process described hereafter is formed by conventional local oxidation of silicon substrate (LOCOS). It should be noted that any variations of the LOCOS process can be used for recess channel formation. This LOCOS step might be the same that forms the usual LOCOS isolation regions. As shown in FIG. 4A, a silicon substrate 50 includes a pad silicon oxide layer 52, and on top of the pad oxide a nitride film 54 and oxide layer 56 are deposited. The nitride is patterned using optical lithography to form a 0.4 μm opening. The opening is narrowed by forming nitride spacer 58 in the opening area. The final opening area can be well defined by controlling the deposition and etching in the spacer formation.

Figure 4B:
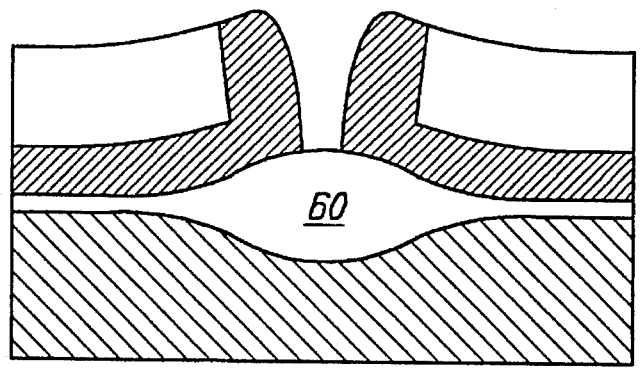
Figure 4C:
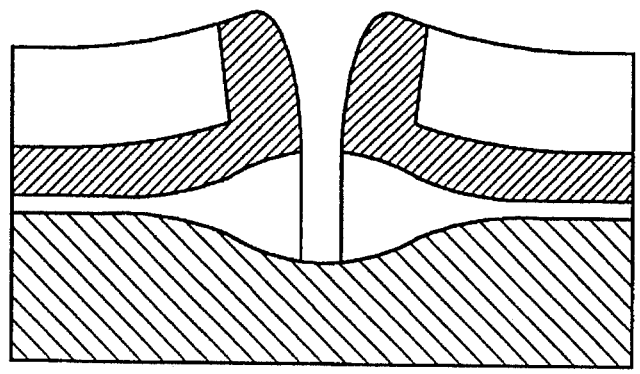

After a wet oxidation process, thick silicon oxide 60 is grown in the opening area and oxide bird's beaks encroach sideways as shown in FIG. 4B. The gate region is opened by plasma etching the oxide using the nitride as a mask, as shown in FIG. 4C. Gate oxide is grown after sacrificial oxide growth, threshold/punchthrough implant and sacrificial oxide removal (FIG. 4D). Then the material for the gate electrode is deposited using chemical-vapor-deposition (CVD) and etched back (FIG. 4E, 4F). This deposition and etch-back process is similar to conventional contact/via plug-filling processes and is well-developed. The material that can be used for the electrode includes polysilicon, silicide, poly Si-Ge, TiN, and tungsten. Poly Si-Ge, TiN and tungsten are particularly attractive due to their low resistivity and mid-gap workfunction values. Another advantage of this gate-filling process is that the gate-electrode interconnect in the field region can be simultaneously formed in the field region by "ditch-filling" and is automatically planarized.

Figure 4H:
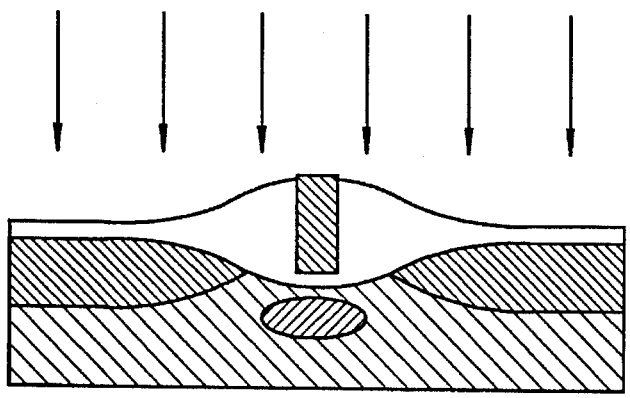
Figure 4I:
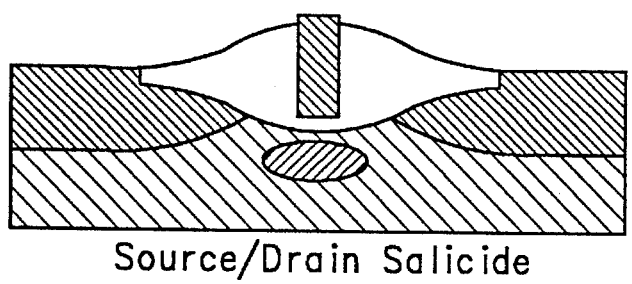
Figure 4J:
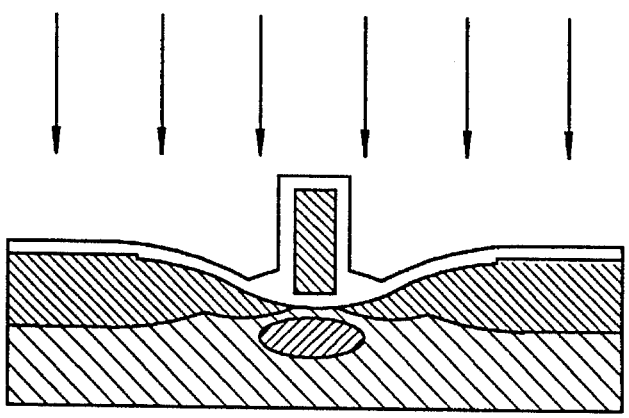

After the nitride is removed by wet etching (FIG. 4G), the deep source/drain is implanted (FIG. 4H). Because of the gate-recess, the deep source/drain junction will not affect the MOSFET short-channel performance. The remaining bird's beak oxide is then thinned down by dry etching, as shown in FIG. 4I, then LDD or shallow source/drain extensions are implanted, as shown in FIG. 4J. Alternatively, the deep source/drain and LDD or shallow source/drain extensions are implanted at the same time. Channel implant and punchthrough implant can be performed before the gate oxide growth or after the source/drain implant, as described above. Importantly, the process provides for junction shape tailoring to optimize the short channel effect and the current drive.

It will be obvious to those skilled in the art that one could apply this invention to p-channel MOSFET transistors. It is also obvious to apply the invention to a buried-channel type device. That is, p channel transistors with n+ poly gate typically have a p type layer near the surface. For such devices, one would implant n type donor dopant such as As on P.

Thus, while the invention has been described with reference to specific embodiments, the description is illustrative of the invention and is not to be construed as limiting the invention. Various modifications and applications might occur to those skilled in the art without departing from the true scope and spirit of the invention as defined by the appended claims.

What is claimed is:

1. A method of fabricating a field effect transistor in a surface region of a semiconductor substrate comprising the steps of a) providing a semiconductor substrate having a pad silicon oxide layer on a surface of the substrate, b) forming a silicon nitride layer over said pad silicon oxide layer, c) removing a portion of said silicon nitride layer to expose a surface region of said substrate, d) oxidizing said surface region, thereby forming an oxide layer, e) removing a portion of said oxide layer to form an opening and expose a portion of said surface region, f) implanting dopant ions through the opening in said oxide layer and forming a punchthrough stopper region spaced from said surface region, g) forming a gate dielectric on said portion of said surface region, h) depositing gate electrode material on said gate dielectric and overlying said silicon nitride layer, i) removing both said gate electrode material overlying said silicon nitride layer and said silicon nitride layer thereby leaving a gate electrode on said gate dielectric, and j) forming source and drain regions in said surface region using said gate electrode as an implantation mask for self-alignment.

2. The method of fabricating a MOSFET device as defined in claim 1 and further including the step of forming nitride spacers after step b).

3. The method of fabricating a MOSFET device as defined in claim 1 and further including the step of forming source/drain junctions and source/drain extensions.

4. The method of fabricating a MOSFET device as defined in claim 1 wherein step (e) includes implanting said dopant ions through said gate electrode into said surface region and forming said punchthrough stopper region self-aligned with said gate electrode.

* * * * *